US012685209B2

(12) United States Patent
Leung et al.

(10) Patent No.: US 12,685,209 B2
(45) Date of Patent: Jul. 14, 2026

(54) SEMICONDUCTOR PACKAGE WITH A CURED ELECTRICALLY CONDUCTIVE PASTE INTERCONNECT AND METHOD FOR PRODUCING THE SAME

(71) Applicant: NEXPERIA B.V., Nijmegen (NL)

(72) Inventors: Chi Ho Leung, Nijmegen (NL); Shun Tik Yeung, Nijmegen (NL); King Man Tai, Nijmegen (NL); Ka Shing Martin Li, Nijmegen (NL)

(73) Assignee: Nexperia B.V., Nijmegen (NL)

( * ) Notice: Subject to any disclaimer, the term of this patent is extended or adjusted under 35 U.S.C. 154(b) by 777 days.

(21) Appl. No.: 18/052,246

(22) Filed: Nov. 3, 2022

(65) Prior Publication Data

US 2023/0134075 A1 May 4, 2023

(30) Foreign Application Priority Data

Nov. 3, 2021 (EP) ..................................... 21206129

(51) Int. Cl.
| | |
|---|---|
| *H10W 74/10* | (2026.01) |
| *H10W 70/40* | (2026.01) |
| *H10W 74/01* | (2026.01) |
| *H10W 74/47* | (2026.01) |
| *H10W 72/00* | (2026.01) |

(Continued)

(52) U.S. Cl.
CPC ....... *H10W 74/121* (2026.01); *H10W 70/421* (2026.01); *H10W 74/01* (2026.01); *H10W 74/111* (2026.01); *H10W 74/47* (2026.01); *H10W 72/016* (2026.01); *H10W 72/07631* (2026.01); *H10W 72/625* (2026.01);

(Continued)

(58) Field of Classification Search
CPC ....................................................... H01L 24/40
USPC ........................................................ 257/666
See application file for complete search history.

(56) References Cited

U.S. PATENT DOCUMENTS

| | | | |
|---|---|---|---|
| 8,729,710 B1 * | 5/2014 | Kim ........................ | H01L 24/24 257/774 |
| 2003/0001252 A1 * | 1/2003 | Ku ....................... | H01L 23/3107 257/686 |

(Continued)

FOREIGN PATENT DOCUMENTS

EP 3886147 A1 9/2021

OTHER PUBLICATIONS

Extended European Search Report for corresponding European application EP21206129.5, 9 pages dated May 9, 2022.

*Primary Examiner* — Ajay Arora
(74) *Attorney, Agent, or Firm* — Ruggiero McAllister & McMahon LLC

(57) ABSTRACT

A method for producing a semiconductor package includes providing a lead frame and a bond pad with a space therebetween. The frame is provided with a die bonded thereon and a die pad. The die, the pad, a part of the frame, a part of the bond pad and the space between the frame and the bond pad are encapsulated. Part of the first encapsulation is removed to create a cavity having a bottom surface including an exposed surface of the die, an exposed surface of the pad, an exposed surface of the bond pad and a connecting region between the exposed surface of the pad and the bond pad. The cavity is partly filled with an electrically conductive paste. The electrically conductive paste is cured to obtain an interconnect between the die pad and the bond pad. The interconnect is encapsulated.

18 Claims, 2 Drawing Sheets

(51) Int. Cl.
    *H10W 72/60*         (2026.01)
    *H10W 90/00*         (2026.01)

(52) U.S. Cl.
    CPC ........ *H10W 72/652* (2026.01); *H10W 72/653*
                (2026.01); *H10W 90/761* (2026.01)

(56)              References Cited

U.S. PATENT DOCUMENTS

2008/0073794 A1\*   3/2008   Obata ............... H01L 23/49524
                                257/E23.044
2008/0303131 A1\*  12/2008  McElrea ................. H01L 24/25
                                257/E23.001
2013/0037935 A1\*   2/2013  Xue .................... H01L 23/3114
                                257/737
2021/0050226 A1     2/2021  Derai et al.

\* cited by examiner

SEMICONDUCTOR PACKAGE WITH A CURED ELECTRICALLY CONDUCTIVE PASTE INTERCONNECT AND METHOD FOR PRODUCING THE SAME

CROSS REFERENCE TO RELATED APPLICATION

This application claims the benefit under 35 U.S.C. § 119(a) of European Application No. 21206129.5 filed Nov. 3, 2021, the contents of which are incorporated by reference herein in their entirety.

BACKGROUND OF THE DISCLOSURE

1. Field of the Disclosure

The present disclosure relates to a semiconductor package and a method for producing a semiconductor package.

2. Description of the Related Art

Various semiconductor chip packages are known which provide support for an integrated circuit chip or die and associated bond wires. These packages provide protection from hostile environments and enable surface mounting of the die to and interconnection with a printed circuit board. A typical package comprises a lead frame and a bond pad with a space therebetween, wherein the lead frame is provided with a die bonded thereon. The die is provided with a die pad and the die pad is electrically coupled to the bond pad via bonding leads or wires. An encapsulating material, such as plastic, epoxy, or resin, is formed over the die and bonding wires and a portion of the lead frame and bond pad and fills a space between the lead frame and bond pad.

Typically, a wire bond, a ribbon bond or a clip bond is used as an interconnect for electrically coupling the die pad and the bond pad.

SUMMARY

A summary of aspects of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects and/or a combination of aspects that may not be set forth.

According to an example there is provided a method for producing a semiconductor package, in which an interconnect between a die pad and a bond pad is provided by a cured electrically conductive paste. A first encapsulation is provided to encapsulate the die and part of the bond pad. Part of the first encapsulation is removed to create a cavity so that the die has an exposed surface comprising an exposed surface of the die pad and the bond pad has an exposed surface. The cavity is partly filled with an electrically conductive paste, which is subsequently cured to obtain an interconnect. A second encapsulation is provided over the interconnect, to obtain the semiconductor package.

Since the contact area between the die pad and the interconnect and the contact area between the bond pad and the interconnect can be adjusted according to the needs, the degree of the electrical and thermal connection between the die pad and the bond pad can be suitably controlled.

Further, the interconnect according to the disclosure may have cost benefit over known interconnect, in particular Cu clip or 12×50 micrometer Cu wire. The interconnect according to the disclosure is more flexible than Cu clip and has an advantage regarding time to market over clip bond. The interconnect according to the disclosure does not require clip design. The interconnect according to the disclosure has a better Rdson (drain-source on resistance) compared to a wire bond.

The Rdson as mentioned above refers to the drain-source resistance for a Metal Oxide Semiconductor, MOS, Field Effect Transistor, MOSFET. The particular disclosure may especially be useful if the die pad is connected to either the source terminal or drain terminal, such that the source terminal and/or drain terminal of the die is made available at the bond pad using the conductive paste. The conductive paste may have better electrical properties compared to prior art wire bonding techniques, thereby improving Rdson.

Optionally, the method comprises electrically connecting one of the die pads, for example the gate terminal, to the bond pad or to a further bond pad. This is performed before the encapsulation by the first encapsulation. In these cases, creating the cavity in the first encapsulation is performed such that the gate wire is not exposed. The further bond pad may e.g. be a low power required control terminal, such as a gate terminal for MOS.

The present disclosure may thus especially be suitable for using the conductive paste for the drain terminal and source terminal in case the die is an MOSFET, as this would reduce the rdson of the MOSFET.

The bond pad may be used for connecting the package to an external circuit board, like a printed circuit board. The bond pad may thus be considered as an external terminal for mounting the package to the printed circuit board.

When the die is used as a Metal Oxide Semiconductor, MOS, Field Effect Transistor, FET, the MOSFET may have at least three connections to the outside world, namely the gate terminal, the source terminal and the drain terminal. The die pad may be considered as a metal layer that connects to any of these three terminals.

The present disclosure is described in conjunction with the appended figures. It is emphasized that, in accordance with the standard practice in the industry, various features are not drawn to scale. In fact, the dimensions of the various features may be arbitrarily increased or reduced for clarity of discussion.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

The above and other aspects of the disclosure will be apparent from and elucidated with reference to the examples described hereinafter.

DETAILED DESCRIPTION

According to an example of the method and the semiconductor package of the present disclosure, an interconnect between the die pad and the bond pad is provided by a cured electrically conductive paste. Since the contact area between the die and the interconnect and the contact area between the bond pad and the interconnect can be adjusted according to the needs, the degree of the electrical and thermal connection between the die pad and the bond pad can be suitably controlled.

Figure 1:
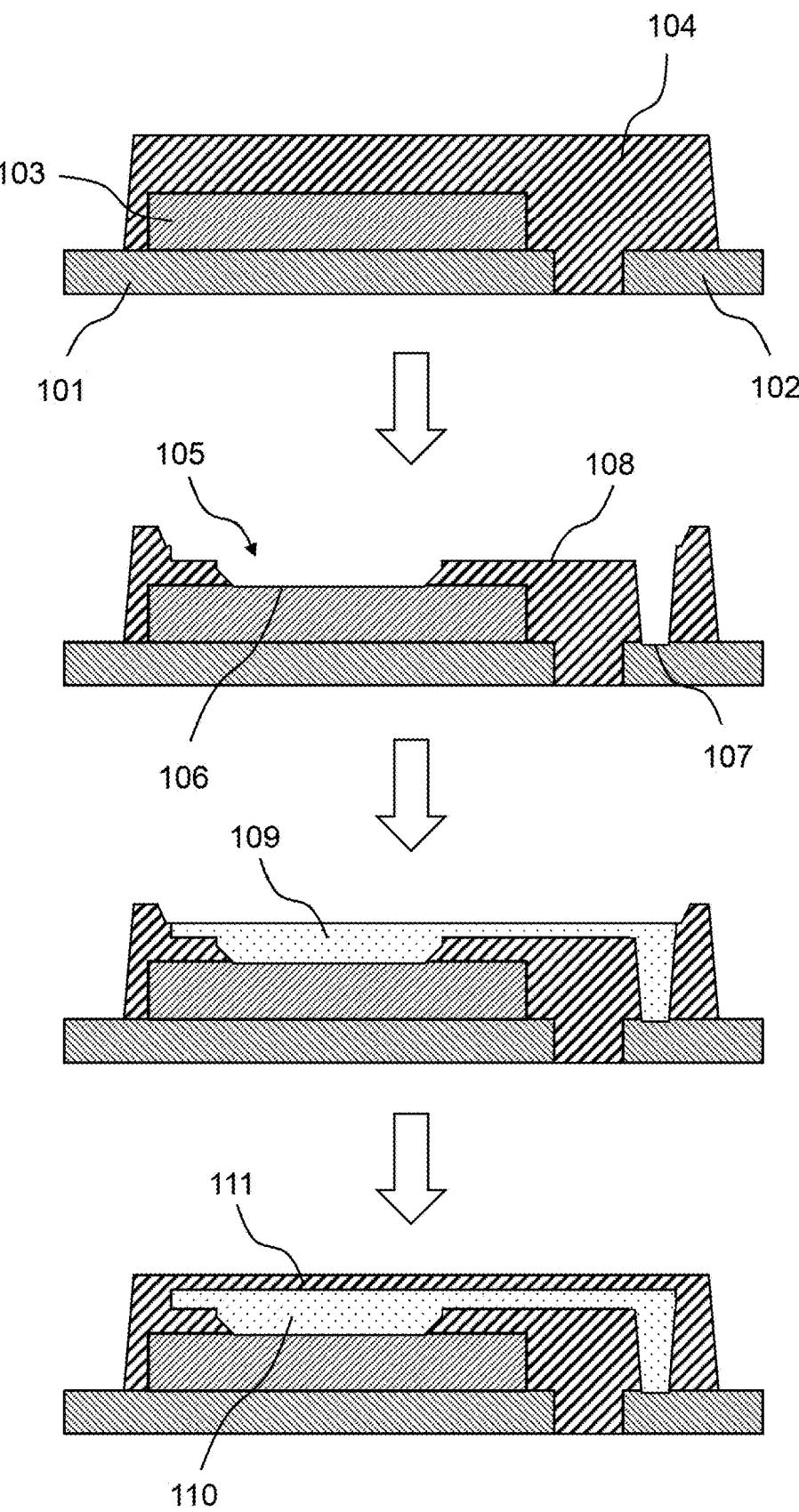
FIG. 1 shows an embodiment of the method for producing the semiconductor package.

FIG. 1 shows an example of the method for producing the semiconductor package.

A lead frame 101 and a bond pad 102 is provided. A die 103 is bonded on the lead frame 101 by known methods e.g. with an epoxy resin or a die bond material layer. The die 103 may be bonded with epoxy dispensing type, print head type, or the like applications, and then cured at high curing temperatures in a box oven or the like. The die bond material layer may be a die attach adhesive such as resin or epoxy containing silver, epoxy die attach, and the like. A die pad is provided on the surface of the die 103 opposite from the lead frame 101.

The die 103, a part of the lead frame 101, a part of the bond pad 102 and the space between the lead frame 101 and the bond pad 102 are encapsulated by a first encapsulation 104. The encapsulation may be made by known methods. The first encapsulation 104 may comprise or consist of a known encapsulation material such as epoxy molding compound.

A cavity 105 is created in the first encapsulation 104 by removing part of the first encapsulation 104. The cavity 105 has a newly exposed surface defining its bottom surface. This may e.g. be performed by laser or by mechanical machining (e.g. computer numerical control (CMC) machining) to remove part of the first encapsulation 104. The first encapsulation 104 is removed such that the die 103 has an exposed surface 106 and the bond pad 102 has an exposed surface 107. The exposed surface 106 of the die comprises an exposed surface of the die pad. The area of the exposed surface 106 and the area of the exposed surface 107 may advantageously be selected to provide the desired degree of electrical and thermal connection between the die pad and the bond pad 102. The first encapsulation 104 between these exposed surfaces 106, 107 is also partly removed to define an area having a smaller height than the surrounding area (defining a connecting region 108). Thus, a cavity 105 is created having a bottom surface comprising the exposed surface 106 of the die 103, the exposed surface 107 of the bond pad 102 and the connecting region 108 between the exposed surface 106 of the die 103 and the exposed surface 107 of the bond pad 102.

Subsequently, an electrically conductive paste 109 is dispensed into the cavity 105. The cavity 105 is partly filled by the paste 109 to cover the bottom surface of the cavity. The paste 109 covers and connects the exposed surface 106 of the die and the exposed surface 107 of the bond pad via the connecting region 108. The volume of the paste 109 may be adjusted to obtain the desired degree of electrical and thermal connection between the die pad and the bond pad 102. A space remains in the cavity 105 above the electrically conductive paste 109. The electrically conductive paste 109 may e.g. be an epoxy resin comprising Ag or a Cu sintering paste.

Subsequently, the electrically conductive paste 109 in the cavity is cured to obtain an interconnect 110 between the die pad and the bond pad 102. The curing may be performed by known methods.

Subsequently, a second encapsulation 111 is provided over the interconnect to obtain the semiconductor package. The second encapsulation 111 may be made of a known encapsulation material such as epoxy molding compound. The first encapsulation 104 and the second encapsulation 111 may be made of the same material or different materials. For example, the first encapsulation 104 may comprise or consist of a first epoxy molding compound and the second encapsulation 111 may comprise or consist of a second epoxy molding compound. The first epoxy molding compound and the second epoxy molding compound may be of the same composition or of different composition. When they are of different composition, the type and/or the amount of at least one component of the first and the second epoxy molding compound may be different, and/or at least one property (e.g. viscosity) of the first and the second epoxy molding compound may be different.

In any case, the first and the second encapsulations may comprise electrically non-conductive materials, to ensure a proper electrical insulation to the conductive paste.

Figure 2:
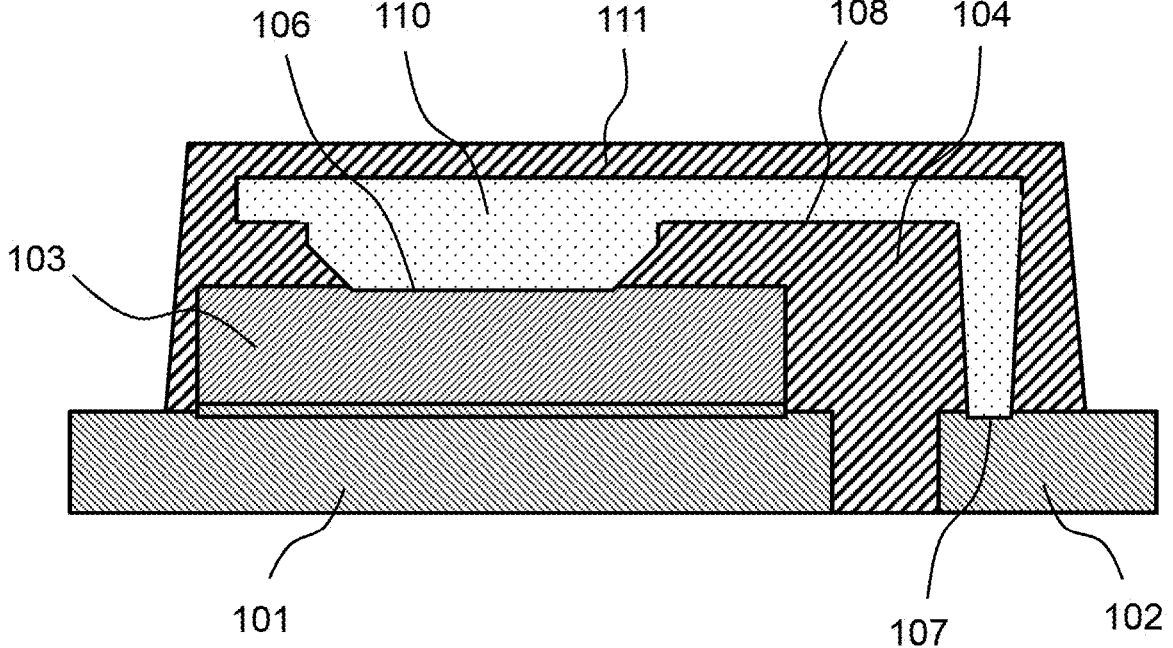
FIG. 2 shows a cross section of an embodiment of the semiconductor package.

FIG. 2 shows a cross section of an embodiment of the semiconductor package. The semiconductor package comprises a lead frame 101 and a bond pad 102 with a space therebetween. The lead frame 101 is provided with a die 103 bonded thereon. A die pad is provided on the surface of the die 103 opposite from the lead frame 101.

The semiconductor package further comprises an interconnect 110 between the die pad and the bond pad 102 comprising a cured electrically conductive paste.

An encapsulation 104, 111 encapsulates the interconnect 110, the die 103, the die pad, a part of the lead frame 101, a part of the bond pad 102 and the space between the lead frame 101 and the bond pad 102.

In this example, the encapsulation comprises a first encapsulation 104 covering the die 103, the die pad, the part of the lead frame 101, the part of the bond pad 102 and the space between the lead frame and the bond pad. The encapsulation further comprises a second encapsulation 111 covering the interconnect 110. The second encapsulation 111 is provided on top of the interconnect 110. The first encapsulation 104 and the second encapsulation 111 may be provided at a different timing. The first encapsulation 104 may be provided before the interconnect 110 is provided and the second encapsulation 111 may be provided after the interconnect 110 is provided. The first encapsulation 104 and the second encapsulation 111 may be made of the same material or different materials.

The ensuing description above provides preferred exemplary embodiment(s) only, and is not intended to limit the scope, applicability or configuration of the disclosure. Rather, the ensuing description of the preferred exemplary embodiment(s) will provide those skilled in the art with an enabling description for implementing a preferred exemplary embodiment of the disclosure, it being understood that various changes may be made in the function and arrangement of elements, including combinations of features from different embodiments, without departing from the scope of the disclosure.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." As used herein, the terms "connected," "coupled," or any variant thereof means any connection or coupling, either direct or indirect, between two or more elements; the coupling or connection between the elements can be physical, logical, electromagnetic, or a combination thereof. Additionally, the words "herein," "above," "below," and words of similar import, when used in this application, refer to this application as a whole and not to any particular portions of this application. Where the context permits, words in the Detailed Description using the singular or plural number may also include the plural or singular number respectively. The word "or" in reference to a list of two or more items, covers all of the following interpretations of the word: any of the items in the list, all of the items in the list, and any combination of the items in the list.

In the description above, for the purposes of explanation, numerous specific details are set forth in order to provide a thorough understanding of implementations of the disclosed technology. It will be apparent, however, to one skilled in the art that embodiments of the disclosed technology may be practiced without some of these specific details.

What is claimed is:

1. A method for producing a semiconductor package, comprising the steps of:

providing a lead frame and a bond pad with a space therebetween wherein a bottom surface of bond pad comprises an external terminal for mounting to a printed circuit board at a bottom surface of the semiconductor package;

wherein the lead frame is provided with a die bonded thereon and the die is provided with a die pad;

wherein the die, the die pad, a part of the lead frame, a part of the bond pad and the space between the lead frame and the bond pad are encapsulated by a first encapsulation, and wherein the encapsulation encapsulates a top surface of the bond pad opposite and directly above the bottom surface of the bond pad comprising the external terminal;

removing part of the first encapsulation to create a cavity having a bottom surface comprising an exposed surface of the die comprising an exposed surface of the die pad, an exposed surface of the bond pad and a connecting region between the exposed surface of the die pad and the exposed surface of the bond pad;

partly filling the cavity with an electrically conductive paste to cover the bottom surface of the cavity;

curing the electrically conductive paste to obtain an interconnect consisting of the cured conductive paste between the die pad and the bond pad; and encapsulating the interconnect by providing a second encapsulation over the interconnect.

2. The method according to claim 1, wherein the removing part of the first encapsulation is performed by laser or computer numerical control machining.

3. The method according to claim 1, wherein the electrically conductive paste is an epoxy resin comprising Ag or a Cu sintering paste.

4. The method according to claim 1, wherein the first and the second encapsulations comprise electrically non-conductive materials.

5. The method according to claim 1, wherein the first encapsulation comprises a first epoxy molding compound and the second encapsulation comprises a second epoxy molding compound, and wherein the first epoxy molding compound and the second epoxy molding compound are of the same composition.

6. The method according to claim 1, wherein the first encapsulation comprises a first epoxy molding compound and the second encapsulation comprises a second epoxy molding compound, and wherein the first epoxy molding compound and the second epoxy molding compound are of different composition.

7. The method according to claim 2, wherein the electrically conductive paste is an epoxy resin comprising Ag or a Cu sintering paste.

8. The method according to claim 2, wherein the first and the second encapsulations comprise electrically non-conductive materials.

9. The method according to claim 2, wherein the first encapsulation comprises a first epoxy molding compound and the second encapsulation comprises a second epoxy molding compound, and wherein the first epoxy molding compound and the second epoxy molding compound are of the same composition.

10. The method according to claim 2, wherein the first encapsulation comprises a first epoxy molding compound and the second encapsulation comprises a second epoxy molding compound, and wherein the first epoxy molding compound and the second epoxy molding compound are of different composition.

11. A semiconductor package comprising a lead frame and a bond pad with a space therebetween, wherein a bottom surface of bond pad comprises an external terminal for mounting to a printed circuit board at a bottom surface of the semiconductor package;

wherein the lead frame is provided with a die bonded thereon and the die is provided with a die pad;

an interconnect between the die pad and the bond pad consisting of a cured electrically conductive paste; and an encapsulation encapsulating the interconnect, the die, the die pad, a part of the lead frame, a part of the bond pad and the space between the lead frame and the bond pad, wherein the encapsulation encapsulates a top surface of the bond pad opposite and directly above the bottom surface of the bond pad comprising the external terminal.

12. The semiconductor package according to claim 11, wherein the electrically conductive paste is an epoxy resin comprising Ag or a Cu sintering paste.

13. The semiconductor package according to claim 12, wherein the encapsulation comprises a first encapsulation covering the die, the die pad, the part of the lead frame, the part of the bond pad and the space between the lead frame and the bond pad and a second encapsulation covering the interconnect.

14. The semiconductor package according to claim 13, wherein the first and the second encapsulations comprise electrically non-conductive materials.

15. The semiconductor package according to claim 13, wherein the first encapsulation comprises a first epoxy molding compound and the second encapsulation comprises a second epoxy molding compound, and wherein the first epoxy molding compound and the second epoxy molding compound are of the same composition.

16. The semiconductor package according to claim 13, wherein the first encapsulation comprises a first epoxy molding compound and the second encapsulation comprises a second epoxy molding compound, and wherein the first epoxy molding compound and the second epoxy molding compound are of different composition.

17. The semiconductor package according to claim 14, wherein the first encapsulation comprises a first epoxy molding compound and the second encapsulation comprises a second epoxy molding compound, and wherein the first epoxy molding compound and the second epoxy molding compound are of the same composition.

18. The semiconductor package according to claim 14, wherein the first encapsulation comprises a first epoxy molding compound and the second encapsulation comprises a second epoxy molding compound, and wherein the first epoxy molding compound and the second epoxy molding compound are of different composition.

* * * * *